United States Patent
Box et al.

(10) Patent No.: US 7,545,478 B2
(45) Date of Patent: Jun. 9, 2009

(54) LITHOGRAPHIC APPARATUS, THERMAL CONDITIONING SYSTEM, AND METHOD FOR MANUFACTURING A DEVICE

(75) Inventors: Wilhelmus Josephus Box, Eksel (BE); Bernardus Antonius Johannes Luttikhuis, Nuenen (NL); Thomas Henricus Jacobus Verhagen, Boxtel (NL)

(73) Assignee: ASML Netherlands B.V., Veldhoven (NL)

( * ) Notice: Subject to any disclaimer, the term of this patent is extended or adjusted under 35 U.S.C. 154(b) by 535 days.

(21) Appl. No.: 10/838,525

(22) Filed: May 5, 2004

(65) Prior Publication Data

US 2005/0248739 A1 Nov. 10, 2005

(51) Int. Cl.
*G03B 27/52* (2006.01)
*G03B 27/54* (2006.01)

(52) U.S. Cl. .............................. 355/30; 355/67; 355/71; 378/34

(58) Field of Classification Search .................... 355/30, 355/53, 67, 71; 378/34, 35; 250/492.2, 492.22
See application file for complete search history.

(56) References Cited

U.S. PATENT DOCUMENTS

| | | | | |
|---|---|---|---|---|
| 4,506,952 A | * | 3/1985 | Grollimund | 359/823 |
| 5,137,349 A | * | 8/1992 | Taniguchi et al. | 353/122 |
| 5,812,242 A | * | 9/1998 | Tokuda | 355/30 |
| 6,529,264 B1 | * | 3/2003 | Ikeda | 355/53 |
| 6,714,278 B2 | * | 3/2004 | Kamiya | 355/30 |
| 6,961,114 B2 | * | 11/2005 | Murayama et al. | 355/30 |
| 2002/0017616 A1 | * | 2/2002 | Ota | 250/492.1 |
| 2004/0051984 A1 | * | 3/2004 | Oshino et al. | 359/845 |
| 2004/0156026 A1 | * | 8/2004 | Kamiya | 355/30 |

FOREIGN PATENT DOCUMENTS

| | | |
|---|---|---|
| JP | 11-191525 A | 7/1999 |
| JP | 11-354431 A | 12/1999 |
| JP | 2000-175434 A | 6/2000 |
| JP | 2000306807 | * 11/2000 |
| JP | 2003-23476 A | 8/2003 |
| JP | 2004-304145 A | 10/2004 |

OTHER PUBLICATIONS

Notice of Reasons for Rejection for Japanese Patent Application No. 2005-130916 dated May 16, 2008.
English Translation of Japanese Official Action issued on Oct. 28, 2008 in related Japanese Application No. 2005-130916.

* cited by examiner

*Primary Examiner*—D. Rutledge
(74) *Attorney, Agent, or Firm*—Pillsbury Winthrop Shaw Pittman LLP

(57) ABSTRACT

A lithographic apparatus having an illumination system configured to provide a radiation beam; a support structure configured to support a patterning device, the patterning device being capable of imparting the radiation beam with a pattern in its cross-section, thus providing a patterned radiation beam; a substrate table configured to hold a substrate; a projection system arranged to project the patterned radiation beam onto a target portion of the substrate, and a projection system support configured to support the projection system on a reference frame. The lithographic apparatus further includes a thermal conditioning system configured to thermally condition the projection system support. The invention further relates to a thermal conditioning system constructed and arranged to thermally condition a projection system support. The invention further relates to a device manufacturing method and a method for manufacturing a device.

36 Claims, 9 Drawing Sheets

LITHOGRAPHIC APPARATUS, THERMAL CONDITIONING SYSTEM, AND METHOD FOR MANUFACTURING A DEVICE

BACKGROUND OF THE INVENTION

1. Field of the Invention

The present invention relates to a lithographic apparatus, a thermal conditioning system, and a method for manufacturing a device.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

In lithographic apparatuses, a projection system is provided for projecting the pattern onto the target portion on the substrate. Typically, the projection system includes a lens which is mounted on a reference frame. The reference frame provides multiple functionalities and requires a highly stable environment. The reference frame may also be referred to the metrology (or metro) frame in the art. In conventional lithographic apparatuses, the projection lens is mounted on the reference frame using lens support blocks. The projection lens, lens support blocks and reference frame form part of a stability chain. It has been found that as the imaging accuracy requirements of lithographic apparatuses increases the thermal stability of the projection lens, lens support blocks and reference frame is desired to be improved. Otherwise a drift in the reference frame is found to occur, which is highly undesirable. Further, it has been found that the accuracy of measuring apparatuses within the lithographic apparatus, in particular, interferometers, which are also mounted on the reference frame, is affected by a drift in the reference frame. A further problem is that the thermal conditioning of the projection lens is compromised.

SUMMARY OF THE INVENTION

It is desirable to address those problems identified with conventional lithographic apparatuses. In particular, it is desirable to reduce the thermal drift of the reference frame. It is further desirable to improve the accuracy of the measuring devices within the lithographic apparatus. It is further desirable to improve the thermal conditioning of the projection lens.

According to an aspect of the invention, there is provided a lithographic apparatus comprising an illumination system configured to provide a radiation beam; a support structure configured to support a patterning device or patterning structure, the patterning device or patterning structure being capable of imparting the radiation beam with a pattern in its cross-section, thus providing a patterned radiation beam; a substrate table configured to hold a substrate; and a projection system arranged to project the patterned radiation beam onto a target portion of the substrate, wherein the lithographic apparatus further comprises a projection system support configured to support the projection system on a reference frame, wherein the lithographic apparatus further comprises a thermal conditioning system configured to thermally condition the projection system support.

In this way, the conditioning of the projection system, in particular, the projection lens is improved. Further, drift in the reference frame is reduced.

In a preferred embodiment, the thermal conditioning system directly thermally conditions, in particular, cools the projection system support. In this way, the heat load through the projection support frame from the projection system towards the reference frame and vice versa can be efficiently reduced.

In a further preferred embodiment, the thermal conditioning system indirectly thermally conditions, in particular, cools the projection system support. In this way, the heat load on the projection system support can be reduced with minimum adaptation of the projection system support being necessary.

In a further preferred embodiment, the thermal conditioning system comprises a thermal conditioning channel configured to transport a thermal conditioning fluid through the projection system support. In particular, the thermal conditioning channel is a closed channel configured to retain the thermal conditioning fluid within the projection system support. In this way, thermal conditioning is achieved without dangers of fluid contamination within the lithographic apparatus.

In a yet further embodiment, the thermal conditioning system comprises a thermal conditioning plate for thermal conditioning the projection system support, wherein the thermal conditioning plate is in thermal contact with the projection system support. In this way, heat transfer is achieved without having to adapt the projection system support.

In a further preferred embodiment, the thermal conditioning system comprises a pump configured to provide a fluid flow through the thermal conditioning channel. In particular, the pump includes a control element configured to provide a fluid flow at a rate, so that in use, an occurrence of flow-induced vibrations in the thermal conditioning system is avoided. In this way, thermal conditioning of the projection system support is achieved without causing any interference within the lithographic apparatus.

In a further preferred embodiment, the fluid flows at a rate substantially within the range of approximately 0.5 to approximately 6 liters per minute. In this way, the heat load is reduced without causing any interference, in particular, with the reference frame or projection lens.

According to a further aspect of the present invention, there is provided a thermal conditioning system constructed and arranged to thermal condition a projection system support.

In a preferred embodiment, the thermal conditioning system comprises a plate arranged, in use, to be mounted in thermal contact with a projection system support, wherein the plate comprises a thermal conditioning channel configured to transport a thermal conditioning fluid, so that in use, the projection system support is thermally conditioned.

According to a further aspect of the present invention, there is provided a device manufacturing method comprising the steps of providing a substrate; providing a projection beam of radiation using an illumination system; using a patterning device to impart the projection beam with a pattern in its cross-section; projecting the patterned beam of radiation onto a target portion of the substrate; and supporting the projection system on a reference frame, and thermal conditioning the projection system support.

According to a further aspect of the present invention, there is provided a method for manufacturing a device comprising transferring a pattern from a patterning device or patterning structure onto a target portion of a substrate using a projection system, wherein the projection system is supported by a thermally conditioned projection system support.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of a patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as needed and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

Like reference symbols in the various figures indicate like elements.

DETAILED DESCRIPTION

Figure 1:
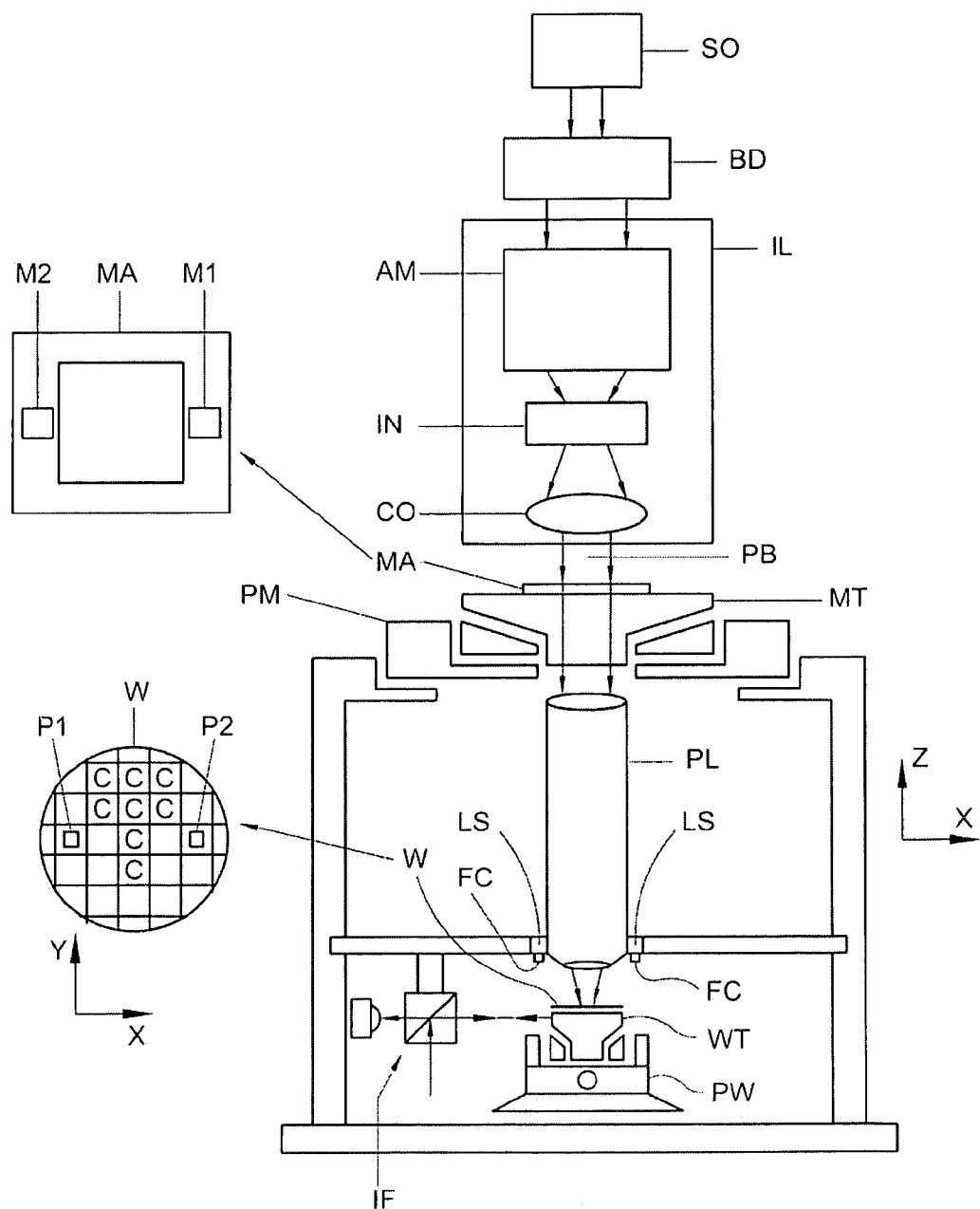
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL for providing a projection beam PB of radiation (e.g. UV radiation, DUV, EUV or x ray radiation);

a first support structure (e.g. a mask table) MT for supporting a patterning device (e.g. a mask) MA and connected to a first positioner PM for accurately positioning the patterning device with respect to item PL;

a substrate table (e.g. a wafer table) WT for holding a substrate (e.g. a resist-coated wafer) W and connected to a second positioner PW for accurately positioning the substrate with respect to item PL; and a projection system (e.g. a refractive projection lens) PL for imaging a pattern imparted to the projection beam PB by a patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on a patterning device, illustrated in the form of the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as needed after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Also shown in FIG. 1 are lens supports LS, which are typically lens support blocks for supporting the projection lens PL on a reference frame MF. Typically, the lens supports LS are rigidly attached to both the projection lens PL and the reference frame MF. The reference frame provides multiple functionalities. As well as supporting the lens supports LS it further supports an interferometer IF, including Z-mirrors ZM, which form part of the interferometer IF. The reference frame is also referred to in the art, as a metrology (or metro) frame. In FIG. 1, two lens supports LS are provided. Typically, as shown in more detail in FIG. 4, three lens supports LS are provided in a three point arrangement. The lens supports LS are typically made of high strength material.

Typically, the lens supports LS material may in addition, or alternatively, have a low coefficient of thermal expansion. In particular, depending on the material of the lens and the reference frame, a high strength material may be required. For example, if there is a large difference in the coefficient of thermal expansion of the materials of the lens and the reference frame. Whilst low thermal expansion may be desirable, other materials having a higher coefficient of thermal expansion may also be used. Suitable materials include high strength steel having a coefficient of thermal expansion in the order of 11 parts per million per Kelvin (ppm/K) and aluminum. The lens supports LS are configured in order to compensate for any tolerances, in particular, tolerance build up between the projection lens and the reference frame.

Further, the lens supports LS are configured so that, should the projection lens and reference frame be subject to mechanical deformations of temperature variations, for example, during operation or during transport, the projection lens PL and reference frame MF are not displaced with respect to one another in X, Y, Rz, Rx and Ry directions. In particular, the lens supports LS are configured so that when subject to thermal or elastic deformation, the projection lens PL remains in the centre of the reference frame MF. This may be achieved, for example, in a structure comprising a leaf spring. The structure of the lens supports LS is shown and described in more detail with reference to FIG. 6.

Also shown in FIG. 1 is a fluid thermal conditioning device FC associated with the lens support LS. The fluid thermal conditioning device FC conditions the lens support LS to reduce the heat load through the lens support LS. In one embodiment, the thermal conditioning device FC cools the lens support LS. It has been found that the heat load from the projection lens PL, in particular, results in a drift of the reference frame. In particular, high drifts were found to occur in the reference frame made of aluminum. By thermally conditioning the lens support LS, it has been found that the drift is reduced. In particular, any drift in the X and Y directions in the reference frame MF is reduced. Further, a performance increase in the projection system is provided in the Z direction.

Figure 2:
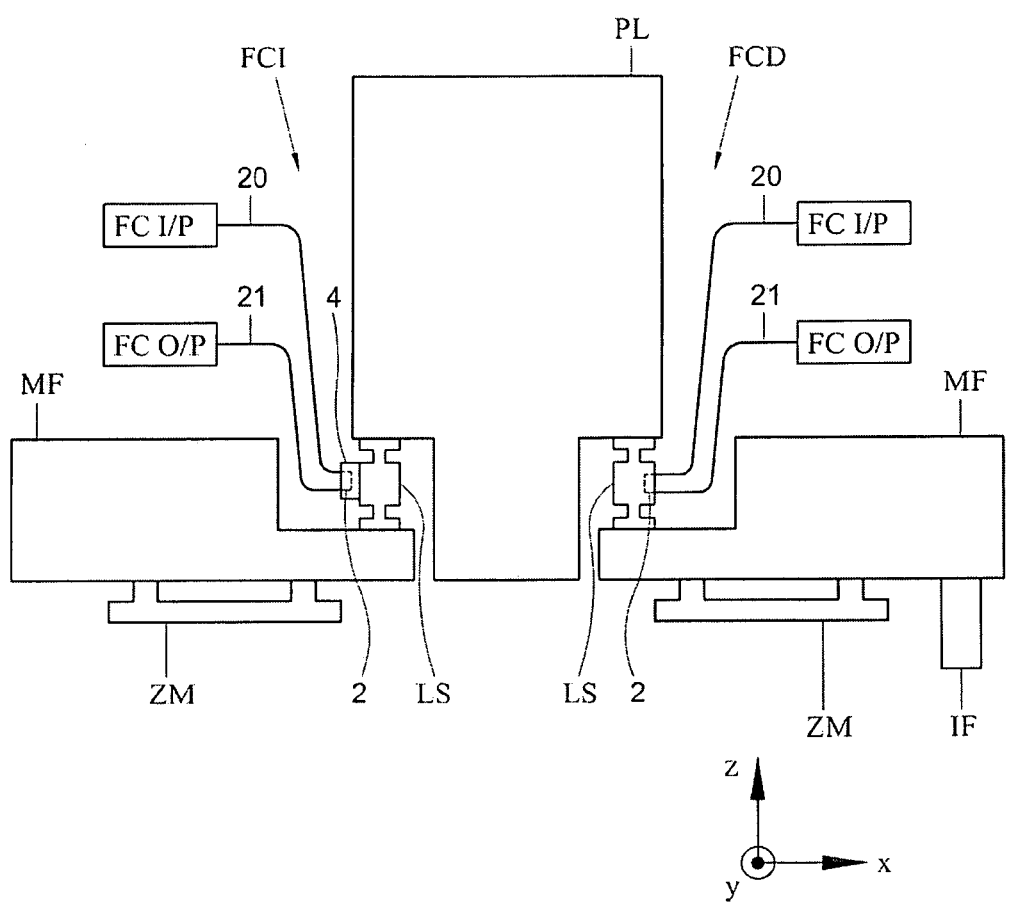
FIG. 2 depicts details of a lithographic apparatus including a thermal conditioning system according to an embodiment of the invention.

FIG. 2 depicts a lithographic apparatus including a thermal conditioning system according to an embodiment of the invention. In particular, FIG. 2 shows a projection system PL including a projection lens PL for projecting the patterned beam onto a target portion of the substrate. Also shown is a projection system support LS for supporting the projection system PL on a reference frame MF. A thermal conditioning system FCI, FCD for thermal conditioning the projection system support is also provided. Typically, the thermal conditioning system is a fluid thermal conditioning system. In one embodiment, the thermal conditioning system FCD directly cools the projection system support. In an alternative embodiment, the thermal conditioning system FCI indirectly cools the projection system support. Both embodiments are shown in FIG. 2. In the direct thermal conditioning system FCD, the thermal conditioning system comprises a thermal conditioning channel 2 for transporting a thermal conditioning fluid through the projection system support LS. The thermal conditioning channel 2 may be a closed channel 2 for retaining a thermal conditioning fluid within the projection system support LS. In this way, fluid is prevented from escaping into the environment in and around the lithographic apparatus.

Figure 9A:
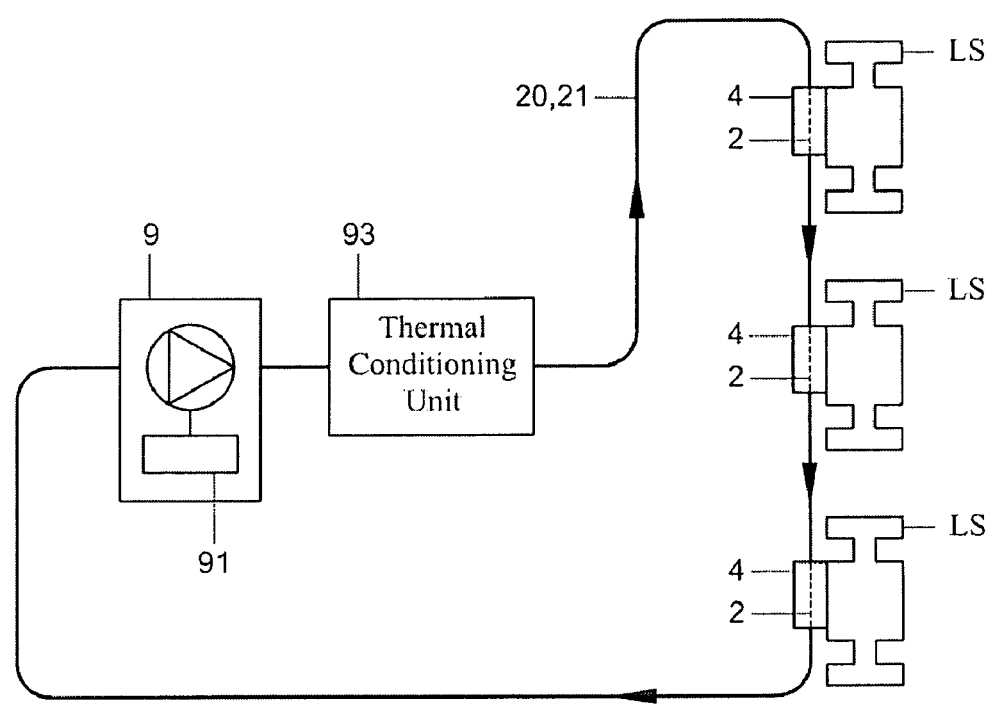
FIG. 9a depicts a thermal conditioning system according to an embodiment of the invention.
Figure 9B:
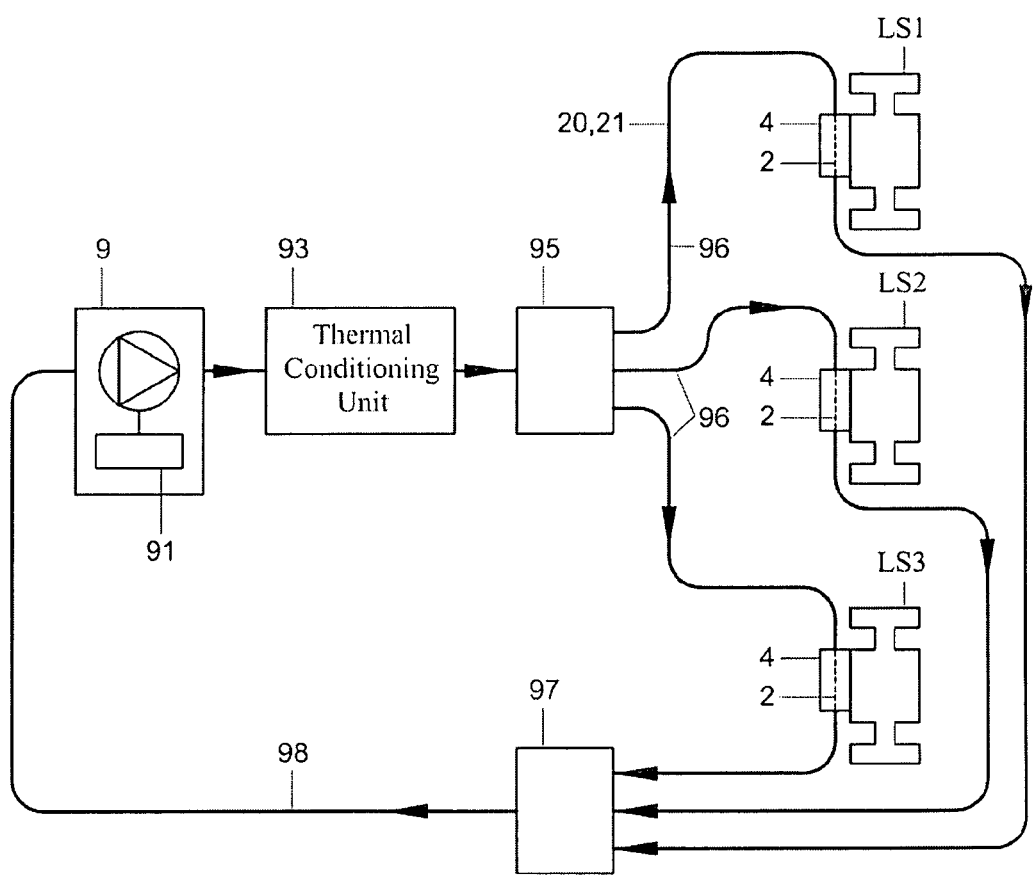
FIG. 9b depicts a thermal conditioning system according to a further embodiment of the invention.

In the indirect thermal conditioning system FCI, the thermal conditioning system FCI may comprise a thermal conditioning plate 4 for thermally conditioning the projection system support LS, wherein the thermal conditioning plate is mounted in thermal contact with the projection system support LS. In a manner similar to the direct thermal conditioning system, the thermal conditioning plate 4 may be provided with a thermal conditioning channel 2 for transporting a thermal conditioning fluid through the thermal conditioning plate 4. Preferably, the thermal conditioning channel is a closed channel for retaining a thermal conditioning fluid within the thermal conditioning plate 4. The thermal conditioning plate 4 may be in the form of a block, and may be made of a material including at least one of aluminum, steel, an iron alloy such as Invar, a ceramic composite material, titanium, copper, gold and silver or the like. The dimensions of the thermal conditioning plate 4 are not critical. Typically, however, the thermal conditioning plate 4 is constructed having a surface providing good thermal contact with the projection system support. Further, the thickness of the plate in the radial direction is sufficient to allow the thermal conditioning channel to be provided within the plate, whilst allowing the plate to be mounted in the space available in the lithographic apparatus. In both embodiments, the heat load on the projection system support is reduced with help of heat transfer in the thermal conditioning channel 4. FIG. 2 further depicts that the thermal conditioning system FCI, FCD comprises a supply pipe 20 for supplying a thermal conditioning fluid to the projection system support LS, a return pipe 21 for returning the thermal conditioning fluid from the projection system support LS, wherein the supply pipe 20, the thermal conditioning channel 2 and the return pipe 21 form a closed system. The supply and return pipes are typically formed of piping or tubing conventionally used in fluid thermal conditioning systems in, for example, lithographic apparatuses. Also provided is a fluid thermal conditioning input FC I/P through which a thermal conditioning fluid is introduced into the thermal conditioning system FCI, FCD and a fluid thermal conditioning output FC O/P at which the thermal conditioning fluid is received. In one embodiment, as shown in FIGS. 9*a* and 9*b*, the thermal conditioning system comprises a closed system around which the fluid is pumped. In an alternative embodiment, the thermal conditioning system is open, wherein a continuous flow of fresh fluid is introduced. It will be understood that in the closed system it is nevertheless possible to introduce fresh fluid into the system at a desired time. The fluid used is typically water. However, any gas, liquid or mixture of gas and liquid may be used. Other particularly suitable fluids include thermally conditioned air. Further, typically, the projection system comprises a projection lens and the projection system support is a projection lens support LS arranged to support the projection lens. Further shown in FIG. 2 are the Z mirrors ZM, and interferometer IF which are mounted on the reference frame MF. It has been found that the projection lens, projection lens support LS, reference frame and interferometer IF form part of a performance stability chain, that is that disturbances in any part of the chain affects the stability of the system. Thus, it is seen that by improving the stability of the projection lens support, the performance of the projection lens, the reference frame and the interferometers IF is improved.

Figure 3:
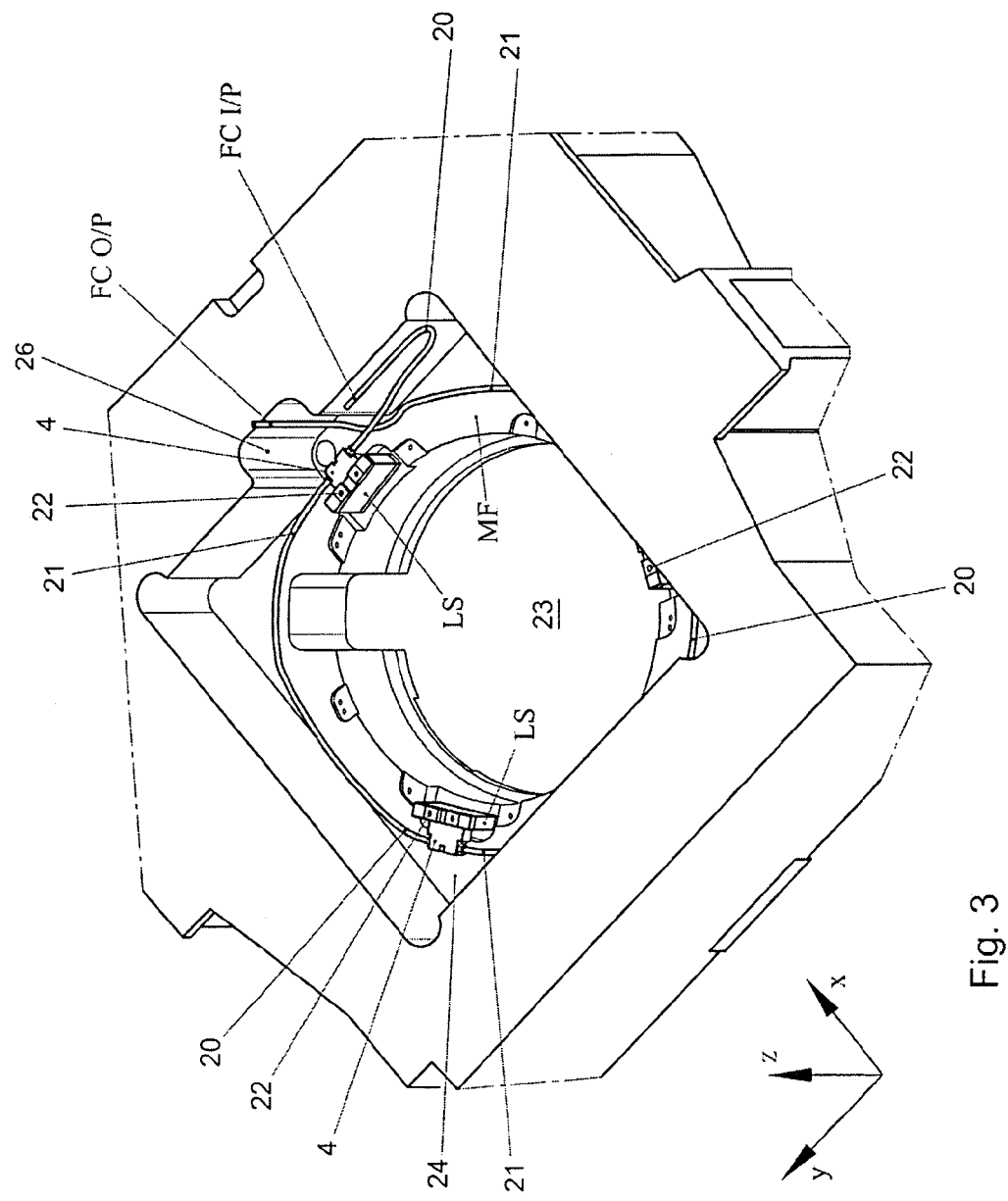
FIG. 3 depicts further details of a lithographic apparatus including a thermal conditioning system according to an embodiment of the invention.

FIG. 3 depicts further details of a lithographic apparatus including a thermal conditioning system according to an embodiment of the invention. In particular, FIG. 3 shows a perspective, top view of the reference frame MF along the Z-direction. In FIG. 3, the projection system is not shown. When assembled the projection system PL is supported by the projection system supports LS on surfaces 22. In use, the projection beam PB passes through aperture 23 and is incident on a substrate (not shown). In FIG. 3, it is seen that the projection system support LS comprises a plurality of support blocks arranged to support the projection system PL, wherein the thermal conditioning system PCI is arranged to cool the plurality of support blocks. In the embodiment shown in FIG. 3, the plurality of blocks are cooled serially, however, in an alternative embodiment, as depicted in FIGS. 9*a* and 9*b*, the plurality of supports may be cooled in parallel. The thermal conditioning system shown in FIG. 3 is an indirect thermal conditioning system, that is, the thermal conditioning channel is formed in a thermal conditioning plate mounted in thermal contact with each support. In FIG. 3, all the supports are cooled indirectly. However, the invention is not limited in this respect, and each support may be cooled indirectly or directly. As mentioned, the thermal conditioning system FCI comprises supply pipes 20 and return pipes 21. The term pipes is intended to cover other suitable means such as hoses and the like. Fluid is introduced via a fluid thermal conditioning input FC I/P and is withdrawn to a fluid thermal conditioning output FC O/P. It has been found that the supply pipes 20, return pipes 21 and thermal conditioning plates 4 may be housed within the reference frame MF in a recess 24. Typically, the recess 24 is formed in order to receive the projection system PL. In a further embodiment, the reference frame MF is further machined in order to provide a recess in which the pipes are disposed. However, as seen in FIG. 3, this is not essential. The supply and return pipes are flexibly formed in order to allow them to deform in to the space available. The input FC I/P and output FC O/P are provided remotely from the reference frame. In one embodiment, to facilitate connection of the supply and return pipes 20, 21 to a remote input and output, a further recess 26 may be formed in the reference frame in order to allow the pipes to enter and exit the space provided in the reference frame MF for the projection system PL without interfering with other components. Depending on the geometry of the reference frame the connection of the supply and return pipes may be achieved with alternative means.

Figure 4:
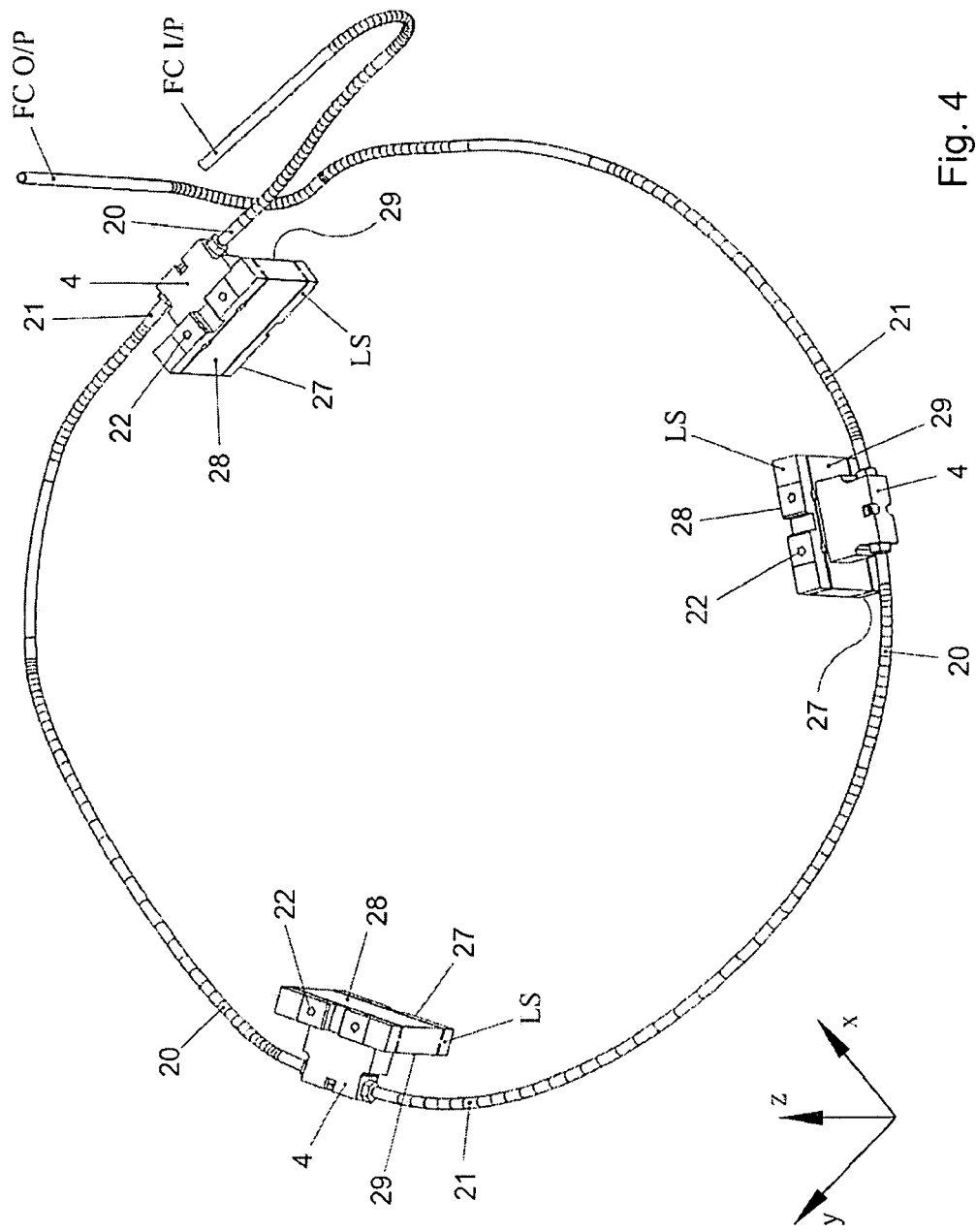
FIG. 4 depicts details of a thermal conditioning system according to an embodiment of the invention.

FIG. 4 depicts details of a thermal conditioning system according to an embodiment of the invention. In particular, FIG. 4 depicts the thermal conditioning system mounted to the lens support blocks LS as shown in FIG. 3 prior to its installation in the reference frame. It can be seen that the projection system support comprises three lens support blocks LS. It has been found that the most stable support of the projection system is provided by three lens support blocks. The lens support blocks LS are typically arranged substantially coplanar, typically in an X-Y plane. The three lens support blocks are substantially rectangular parallelepiped or brick shaped having two opposing longitudinal outer surfaces 28, 29. In use, the lens support blocks LS are disposed substantially equidistant from one another in a triangular arrangement, so that a first one of the outer longitudinal surfaces 28 faces towards a notional centre of the triangle. The second opposing outer surface 29 faces away from the notional centre of the triangle. In FIG. 4, the thermal conditioning plate 4 is mounted on the second opposing outer surface 29. Further in use, the supply and return pipes 20, 21 are arranged to form a ring around the arrangement including the lens support blocks. In this way, optimum use of the available space around the projection system and projection system supports is achieved without compromising the performance of apparatus components.

Each lens support block LS comprises an upper rectangular surface substantially disposed in an X-Y plane, wherein in use the upper rectangular surface 22, provides support to the projection system, typically, the projection lens PL. The height of the lens support block extends substantially in a direction parallel to the Z-direction. The lens support block also comprises a lower rectangular surface 27 substantially disposed in an X-Y plane, wherein in use, the lower rectangular surface 27 is disposed on the reference frame MF. The thermal conditioning system is arranged substantially in a ring, so as to cool each projection system support. The supply and return pipes lie substantially in an X-Y plane. The lens support blocks LS are described in more detail with reference to FIGS. 6-8. Typically, the thermal conditioning system and lens support blocks are assembled prior to their installation in the reference frame. However, assembly may also take place in situ.

Figure 5:
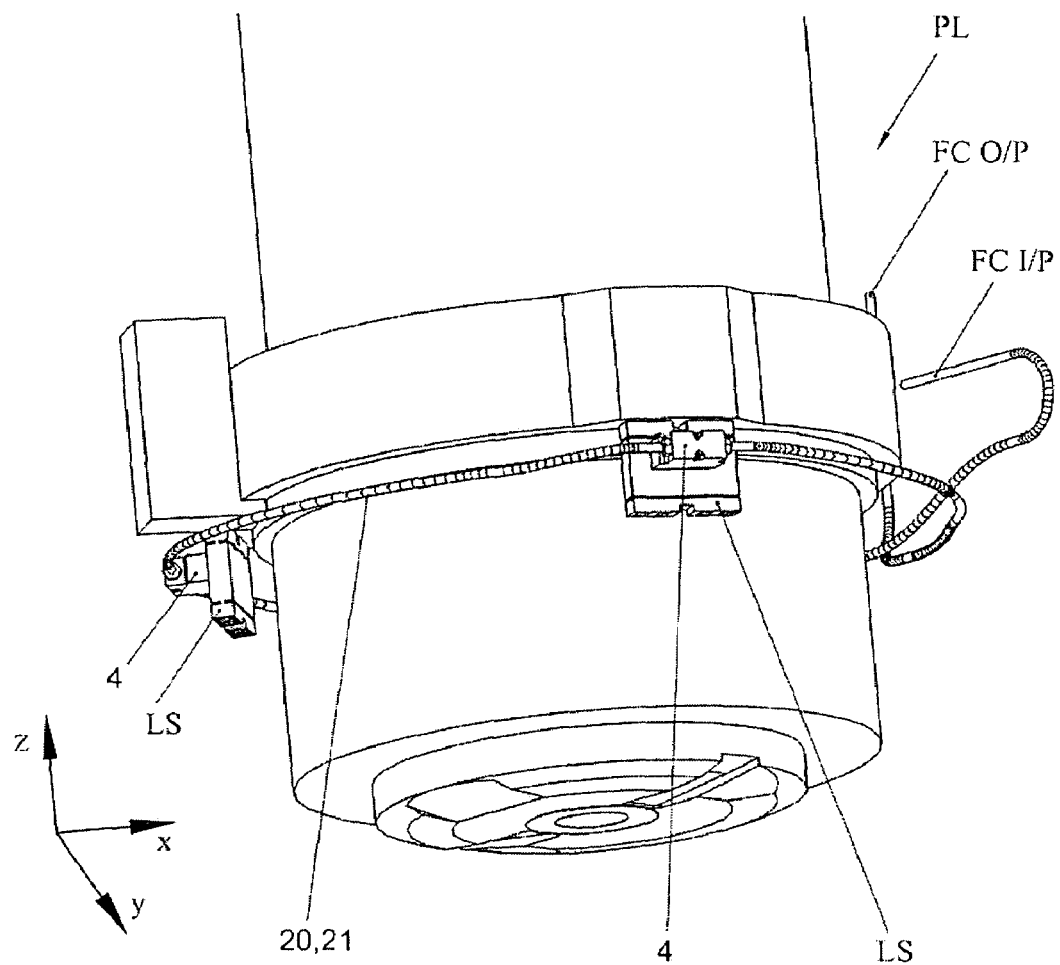
FIG. 5 depicts details of a thermal conditioning system mounted with respect to a projection system according to an embodiment of the invention.

FIG. 5 depicts details of a thermal conditioning system mounted with respect to a projection system according to an embodiment of the invention. In particular, FIG. 5 shows the thermal conditioning system mounted to the lens support blocks LS as shown in FIG. 4, having been mounted to the projection system PL. The arrangement shown in FIG. 5, in use, is disposed in the reference frame MF.

Figure 6:
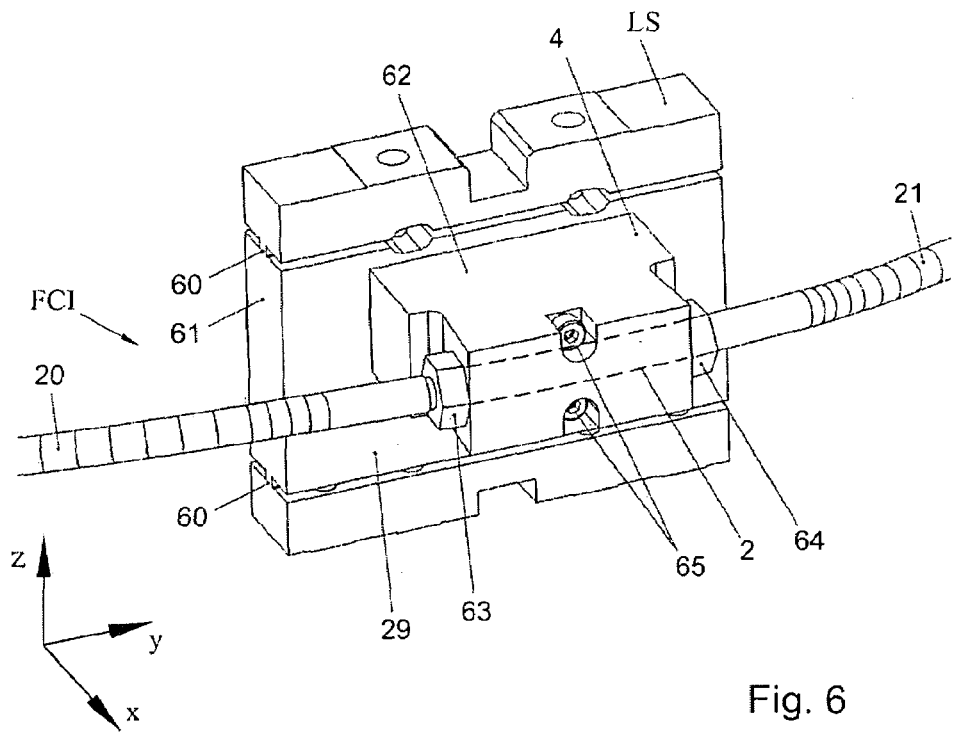
FIG. 6 depicts details of a thermal conditioning system and a projection system support according to an embodiment of the invention.
Figure 7:
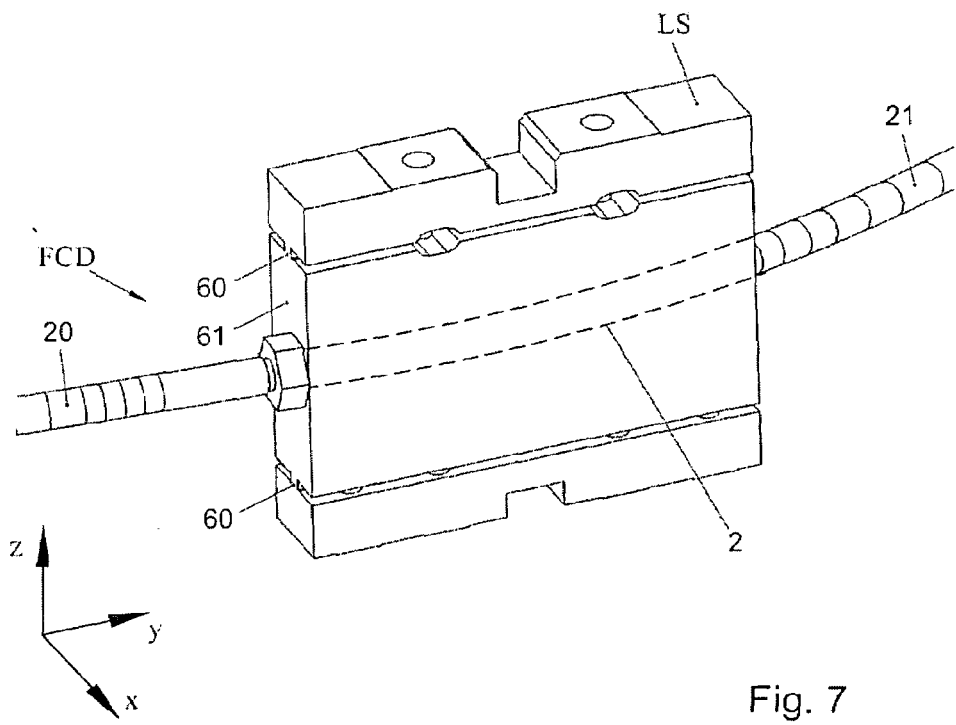
FIG. 7 depicts details of a thermal conditioning system and a projection system support according to a further embodiment of the invention.
Figure 8:
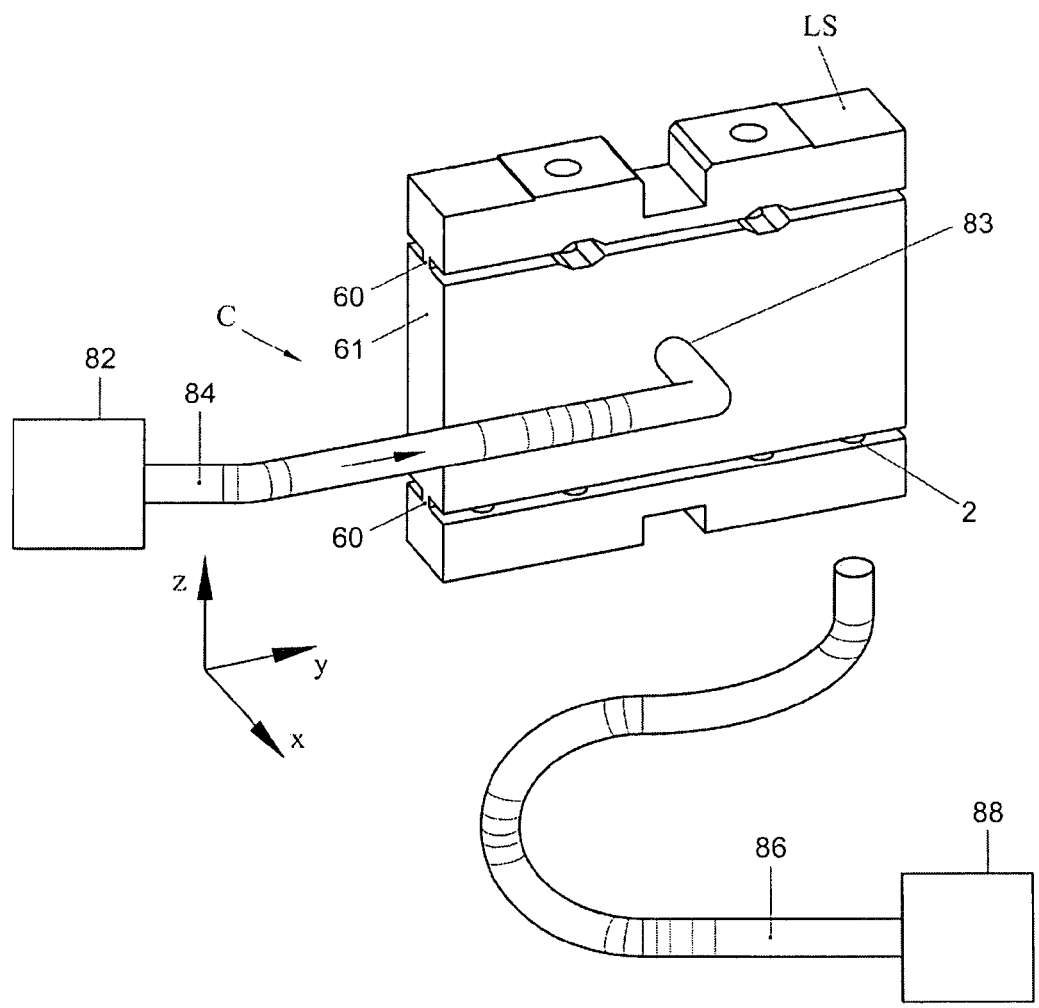
FIG. 8 depicts details of a thermal conditioning system and a projection system support according to a yet further embodiment of the invention.

FIG. 6-8 depict details of a thermal conditioning system and a projection system support according to alternative embodiments of the invention. In particular, FIG. 6 depicts a thermal conditioning system FCI and a projection system support LS in which the projection system support LS is indirectly cooled by a fluid. FIG. 7 depicts a thermal conditioning system FCD and a projection system support LS in which the projection system support LS is directly cooled by a fluid. FIG. 8 depicts a thermal conditioning system C and a projection system support LS in which the projection system support LS is cooled by a gas.

The construction of the projection system support LS is now described with reference to FIGS. 6-8. The construction of the projection system supports for the alternative embodiments is the same, except for in the embodiment shown in FIG. 7 a thermal conditioning channel 2 is formed through the projection system support LS in a substantially longitudinal direction.

As mentioned, the lens support blocks LS are substantially block or plate shaped having a longitudinal axis. The dimensions of the lens support blocks are approximately 100 mm×100 mm×20 mm. In any case the dimensions of two of the sides of the blocks are substantially larger than the third or thickness of the block or plate. The lens support blocks may typically be made of high strength steel or other material, such as aluminum. As previously mentioned, in use, the lens support blocks are rigidly mounted to both the projection system PL and the reference frame MF. The construction of the lens support blocks LS is such that any tolerances are compensated for. In particular, tolerance build up is avoided. To achieve this result, the lens support blocks LS are constructed to form a leaf spring, that is a composite spring, comprising at least two flexible portions 60 joined by a connecting portion 61 to act as a single unit. In particular, the lens support blocks may be stiff in the Z-direction.

In FIG. 6, the thermal conditioning plate 4 is mounted in thermal contact with the lens support block LS on the second outer opposing surface 29. No adaptation of the lens support block LS is necessary. In particular, the thermal conditioning system may comprise a plate arranged, in use, to be mounted in thermal contact with a projection system support, wherein the plate comprises a thermal conditioning channel for transporting a thermal conditioning fluid, so that in use, the projection system support is cooled.

The thermal conditioning plate 4 is provided with a thermal conditioning channel 2. This is formed by boring or otherwise a channel through the thermal conditioning plate 4. The geometry of the thermal conditioning plate 4 is not critical to the invention, however, it has been found that in order to maximize the thermal conditioning effect, the thermal conditioning channel 2 is formed to extend longitudinally through the thermal conditioning plate 4. The thermal conditioning plate 4 may have a substantially T-shaped cross section in an X-Y plane, wherein the cross of the T 62 is arranged to be mounted in thermal contact with the lens support block LS. By increasing the surface of contact between the cooling plate and the lens support block, the heat exchange with the lens support block is further improved. Bolts 63, 64 are provided to ensure a seal between the supply and return pipes 20, 21, respectively. Bolts 65 represent one way in which the thermal conditioning plate 4 may be mounted to the lens support block. Other mounting techniques may also be appropriate such as gluing and the like. Thermal contact can be further improved by using materials having a high thermal conductivity, mounted or applied, using for example thermal paste, between the lens support block and the thermal conditioning plate. In particular, a thermal conducting material may be disposed between the thermal conditioning plate and the projection system support for increasing the thermal contact between the thermal conditioning plate and the projection system support. Yet further, the thermal conducting material is disposed between the thermal conditioning plate and the lens support block.

As mentioned, FIG. 7 depicts details of a thermal conditioning system and a projection system support according to a further embodiment of the invention. In particular, in FIG. 7, the thermal conditioning channel 2 is formed in the lens support block LS. Typically, in order to achieve optimum thermal conditioning along the length of the lens support block in a longitudinal direction, the thermal conditioning channel 2 is provided along the length of the lens support block LS in a longitudinal direction. The location and dimensions and direction or directions of extension of the thermal conditioning channel 2 within the lens support block LS is not critical, provided the thermal conditioning channel is not provided in the direct vicinity of the flexible portions 60. In this way, thermal conditioning is achieved without interfering with the function of the lens support block LS.

As mentioned, FIG. 8 depicts details of a thermal conditioning system and a projection system support according to a yet further embodiment of the invention. In particular, FIG. 8 depicts a thermal conditioning system C and a projection system support LS in which the projection system support LS is cooled by a gas. In particular, the thermal conditioning system comprises a gas supply 82 for supplying a thermal conditioning gas to at least a portion 83 of the projection system support. Typically, the gas may include at least one of air and purified air. The gas supply includes a control element (not shown) for controlling the temperature and flow of the gas provided to the lens support block LS. Typically, the gas supply supplies the gas locally to the portion 82 without causing air turbulence within the environment of the lithographic apparatus. This may be achieved for example, by a directional nozzle or the like. Gas is optionally removed by the provision of an exhaust 86 which is connected to an at least partial vacuum which causes gas to be removed from the vicinity of the lens support block LS. Supply and exhaust pipes or tubes 84, 86, supply and remove, respectively, gas to and from the lens support block LS.

It is commented that whilst the embodiments shown in FIGS. 3-6 depict indirectly cooled lens support blocks including a thermal conditioning system comprising a thermal conditioning plate 4 through which a thermal conditioning channel is formed, directly cooled lens blocks may be used either alternatively or in combination with indirectly and/or gas cooled lens support blocks, that is to a thermal conditioning system including a thermal conditioning channel formed in the lens support blocks as shown in FIG. 7 or to a thermal conditioning system including a gas supply for thermal conditioning the lens support blocks as shown in FIG. 8.

FIG. 9a depicts a thermal conditioning system according to an embodiment of the invention and FIG. 9b depicts a thermal conditioning system according to a further embodiment of the invention. In particular, FIG. 9a depicts an embodiment in which the lens support blocks LS are cooled serially and FIG. 9b shows an alternative embodiment in which the lens support blocks LS are cooled in parallel. It is commented that FIGS. 9a and 9b are shown schematically, in particular, with respect to the arrangement of the lens support blocks LS.

The supply and control of the thermal conditioning fluid is now described with reference to FIGS. 9a and 9b. In particular, the thermal conditioning system FCI, FCD may comprise a pump 9 for causing a fluid to flow through the thermal conditioning channel 2. Further, the pump may include a control element 91 for providing a fluid flow at a rate, so that in use, vibrations in the thermal conditioning system are limited. In a further embodiment, a hydraulic damper is used to reduce fluid vibrations. In this way, thermal conditioning is achieved without interfering with the lithographic apparatus, in particular, the projection lens PL and the reference frame MF. In order to further reduce any impact on the lithographic apparatus, the pump 9 may include a control element 91 for providing a substantially uniform flow with respect to time. Typically, the fluid is controlled to flow at a rate substantially within the range of approximately 0.5 to approximately 6 liters per minute. More typically, the fluid is controlled to flow at a rate of approximately 2 liters per minute. Further, the thermal conditioning system FCI, FCD may comprise a thermal conditioning unit 93 for providing a fluid at a regulated temperature with respect to the temperature of the projection support system. The thermal conditioning unit 93 typically includes a heat exchanger, heater and a control element in order to heat or cool the fluid to a desired temperature. Further, in order to further improve the thermal conditioning effect at the lens support block LS, feedback relating to the temperature of the lens support block LS may be provided, for example, with an electrical circuit, from the lens support block LS to the thermal conditioning unit 93, which the control element acts on in order to provide an optimally thermally conditioned fluid.

As mentioned, in FIG. 9a, the projection system support LS comprises a plurality of support blocks LS arranged to support the projection system PL, wherein the thermal conditioning system FCI, FCD is arranged to cool the plurality of support blocks serially.

As mentioned in FIG. 9b, the projection system support LS comprises a plurality of support blocks LS arranged to support the projection system PL, wherein the thermal conditioning system FCI, FCD is arranged to cool the plurality of support blocks in parallel. To achieve parallel thermal conditioning, the thermal conditioning system FCI, FCD is provided with a first manifold 95 arranged to provide a plurality of parallel channels 96 for transporting a coolant to the plurality of support blocks LS1, LS2, LS3 in parallel. Further, the thermal conditioning system is provided with a second manifold 97 and a pump 9, wherein the second manifold 97 is arranged to combine a plurality of parallel channels 96 into a single channel 98 for transporting the thermal conditioning fluid to the pump 9.

It is commented that whilst the thermal conditioning system described with respect to the present invention may be independent from any other thermal conditioning systems in a lithographic apparatus, it has been found that equally, existing thermal conditioning systems may also be adapted to incorporate the thermal conditioning system of the present invention. The present invention further has application to a thermal conditioning system for thermal conditioning a projection system support.

It is commented that whilst the thermal conditioning system of the present invention has been described in the foregoing with respect to the thermal conditioning of the lens support blocks, which are passive elements, the thermal conditioning system of the present invention, is equally applicable to thermal conditioning active elements in the projection system support, such as actuators, piezoelectric elements and other elements. In the specific embodiments described above, the thermal conditioning system is described as thermally conditioning the projection system support. In particular, it is described as being arranged to cool the projection system support. However, it is also envisaged that the thermal conditioning system may heat the projection system support. In this way, the projection system support is thermally regulated.

While specific embodiments of the invention have been described above, it will be appreciated that the invention may be practiced otherwise than as described. The description is not intended to limit the invention.

The invention claimed is:

1. A lithographic apparatus comprising:
a support structure configured to support a patterning device, the patterning device being capable of imparting a radiation beam with a pattern in its cross-section, thus providing a patterned radiation beam;
a substrate table configured to hold a substrate;
a projection system arranged to project the patterned radiation beam onto a target portion of the substrate;
a projection system support configured to support the projection system on a reference frame and to compensate for thermal or elastic deformation so that the projection system remains in the center of the reference frame; and
a thermal conditioning system comprising a thermal conditioning channel configured to transport a thermal conditioning fluid to thermally condition the projection system support.

2. An apparatus according to claim 1, wherein the thermal conditioning system directly conditions the projection system support.

3. An apparatus according to claim 1, wherein the thermal conditioning system indirectly conditions the projection system support.

4. An apparatus according to claim 1, wherein the thermal conditioning channel is configured to transport the thermal conditioning fluid through the projection system support.

5. An apparatus according to claim 4, wherein the thermal conditioning channel is a closed channel configured to retain the thermal conditioning fluid within the projection system support.

6. An apparatus according to claim 1, wherein the thermal conditioning system comprises a thermal conditioning plate configured to thermally condition the projection system support, wherein the thermal conditioning plate is in thermal contact with the projection system support.

7. An apparatus according to claim 6, wherein the thermal conditioning plate is provided with the thermal conditioning channel, the thermal conditioning channel being constructed to transport the thermal conditioning fluid through or across a surface of the thermal conditioning plate.

8. An apparatus according to claim 7, wherein the thermal conditioning channel is a closed channel for retaining the thermal conditioning fluid within the thermal conditioning plate.

9. An apparatus according to claim 6, wherein the thermal conditioning plate is made of a material including at least one of aluminum, steel, an iron alloy, a ceramic composite material, titanium, copper, gold and silver.

10. An apparatus according to claim 6, wherein the thermal conditioning plate is in the form of a block.

11. An apparatus according to claim 1, wherein the thermal conditioning system comprises a pump configured to provide a fluid flow through the thermal conditioning channel.

12. An apparatus according to claim 11, wherein the pump includes a control element configured to provide a fluid flow at a rate, so that in use, an occurrence of flow-induced vibrations in the thermal conditioning system is limited.

13. An apparatus according to claim 12, wherein the control element includes a hydraulic damper to reduce fluid vibrations.

14. An apparatus according to claim 11, wherein the pump includes a control element arranged to provide a substantially constant flow with respect to time.

15. An apparatus according to claim 11, wherein the fluid flow flows at a rate substantially within the range of approximately 0.5 to approximately 6 liters per minute.

16. An apparatus according to claim 11, wherein the fluid flow flows at a rate of approximately 2 liters per minute.

17. An apparatus according to claim 1, wherein the thermal conditioning fluid comprises a thermal conditioning gas, and wherein the thermal conditioning system comprises a gas supply configured to supply the thermal conditioning gas to at least a portion of the projection system support.

18. An apparatus according to claim 17, wherein the thermal conditioning gas includes at least one of air and purified air.

19. An apparatus according to claim 1, wherein the projection system support comprises a plurality of support blocks arranged to support the projection system, wherein the thermal conditioning system is arranged to cool the plurality of support blocks serially.

20. An apparatus according to claim 1, wherein the projection system support comprises a plurality of support blocks arranged to support the projection system, wherein the thermal conditioning system is arranged to cool the plurality of support blocks in parallel.

21. An apparatus according to claim 20, wherein the thermal conditioning system comprises a first manifold arranged to provide a plurality of parallel channels for transporting a coolant to the plurality of support blocks in parallel.

22. An apparatus according to claim 20, wherein the thermal conditioning system comprises a second manifold and a pump, wherein the second manifold is arranged to combine a plurality of parallel channels into a single channel for transporting a coolant to the pump.

23. An apparatus according to claim 1, wherein the thermal conditioning system comprises a thermal conditioning unit configured to provide the thermal conditioning fluid at a regulated temperature with respect to the temperature of the projection support system.

24. An apparatus according to claim 1, wherein the projection system support comprises the thermal conditioning channel, and wherein the thermal conditioning system further comprises a supply pipe configured to supply the thermal conditioning fluid to the thermal conditioning channel, and a return pipe configured to return the thermal conditioning fluid from the thermal conditioning channel, wherein the supply pipe, the thermal conditioning channel, and the return pipe form a closed system.

25. An apparatus according to claim 1, wherein the projection system comprises a projection lens and the projection system support is a projection lens support arranged to support the projection lens.

26. An apparatus according to claim 1, wherein the thermal conditioning system is arranged to cool the projection system support.

27. An apparatus according to claim 1, wherein the projection system support includes an active element, wherein the thermal conditioning system is arranged to thermally condition the active element.

28. An apparatus according to claim 6, further comprising a thermal conducting material disposed between the thermal conditioning plate and the projection system support configured to increase the thermal contact between the thermal conditioning plate and the projection system support.

29. An apparatus according to claim 28, wherein the projection system support comprises a lens support block and the thermal conducting material is disposed between the thermal conditioning plate and the lens support block.

30. A device comprising:
a thermal conditioner comprising a thermal conditioning channel configured to transport a thermal conditioning fluid to thermally condition a projection system support, the projection system support being configured to support a projection system on a reference frame and to compensate for thermal or elastic deformation so that the projection system remains in the center of the reference frame.

31. A device according to claim 30, wherein the projection system support comprises the thermal conditioning channel.

32. A thermal conditioning system, comprising:
a plate arranged to be mounted in thermal contact with a projection system support that is constructed and arranged to support a projection system and to compensate for thermal or elastic deformation so that the projection system remains in the center of a reference frame, wherein the plate comprises a thermal conditioning channel configured to transport a thermal conditioning fluid to thermally condition the projection system support.

33. A method of manufacturing a device, comprising:
providing a substrate;
using a patterning device to impart a projection beam with a pattern in its cross-section to form a patterned beam of radiation;
projecting the patterned beam of radiation with a projection system onto a target portion of the substrate, the projection system being supported on a reference frame with a projection system support configured to compensate for thermal or elastic deformation so that the projection system remains in the center of the reference frame; and
thermally conditioning the projection system support with a thermal conditioning fluid flowing through a thermal conditioning channel.

34. A method according to claim 33, wherein the projection system support comprises the thermal conditioning channel.

35. A method for manufacturing a device comprising:
transferring a pattern from a patterning device onto a target portion of a substrate using a projection system, the projection system being supported on a reference frame with a projection system support configured to compensate for thermal or elastic deformation so that the projection system remains in the center of the reference frame; and
thermally conditioning the projection system support with a thermal conditioning fluid flowing through a thermal conditioning channel.

36. A method according to claim 35, wherein the projection system support comprises the thermal conditioning channel.

* * * * *

UNITED STATES PATENT AND TRADEMARK OFFICE
CERTIFICATE OF CORRECTION

PATENT NO. : 7,545,478 B2 Page 1 of 1
APPLICATION NO. : 10/838525
DATED : June 9, 2009
INVENTOR(S) : Wilhelmus Josephus Box et al.

It is certified that error appears in the above-identified patent and that said Letters Patent is hereby corrected as shown below:

On title page, item (56) Foreign Patent Documents
replace "JP 2003-23476 A"
with --JP 2003-234276 A--.

Signed and Sealed this

Twenty-fifth Day of August, 2009

David J. Kappos
*Director of the United States Patent and Trademark Office*